(12) United States Patent
Chang (10) Patent No.: US 9,099,379 B2
(45) Date of Patent: Aug. 4, 2015

(54) LED LIGHT WITH ELECTROSTATIC PROTECTION AND BACKLIGHT MODULE USING THE LED LIGHT

(75) Inventor: Kuangyao Chang, Guangdong (CN)

(73) Assignee: Shenzhen China Star Optoelectronics Technology Co., Ltd., Shenzhen, Guangdong Province (CN)

( * ) Notice: Subject to any disclaimer, the term of this patent is extended or adjusted under 35 U.S.C. 154(b) by 392 days.

(21) Appl. No.: 13/520,570

(22) PCT Filed: Apr. 12, 2012

(86) PCT No.: PCT/CN2012/073914
§ 371 (c)(1),
(2), (4) Date: Jul. 4, 2012

(87) PCT Pub. No.: WO2013/149411
PCT Pub. Date: Oct. 10, 2013

(65) Prior Publication Data
US 2013/0256721 A1 Oct. 3, 2013

(30) Foreign Application Priority Data
Apr. 1, 2012 (CN) .......................... 2012 1 0096045

(51) Int. Cl.
*H01L 33/62* (2010.01)
*H01L 33/48* (2010.01)
*H01L 25/16* (2006.01)

(52) U.S. Cl.
CPC .............. *H01L 25/167* (2013.01); *H01L 33/62* (2013.01); *H01L 33/486* (2013.01); *H01L 2224/45144* (2013.01); *H01L 2224/48091* (2013.01); *H01L 2924/3011* (2013.01)

(58) Field of Classification Search
CPC ..... H01L 33/48; H01L 33/483; H01L 33/486; H01L 33/62; H01L 33/64; H01L 33/644; H01L 33/645; H01L 33/647
USPC ....................................... 257/79–100
See application file for complete search history.

(56) References Cited

U.S. PATENT DOCUMENTS 7,579,629 B2 * 8/2009 Inoguchi .......................... 257/98
2007/0200133 A1 * 8/2007 Hashimoto et al. ........... 257/100

FOREIGN PATENT DOCUMENTS

CN       101630078 A    1/2010
CN       101958389 A    1/2011

* cited by examiner

*Primary Examiner* — Matthew W Such
*Assistant Examiner* — Scott Stowe
(74) *Attorney, Agent, or Firm* — Cheng-Ju Chiang (57) ABSTRACT

The present invention provides an LED light with electrostatic protection and a backlight module using the LED light. The LED light includes a carrying frame, a light-emitting die mounted in the carrying frame, and an encapsulation resin encapsulating the light-emitting die in the carrying frame. The carrying frame includes a frame body, first and second copper foils mounted in the frame body, and a first conductive metal plate mounted in the frame body. The first and second copper foils are respectively and electrically connected by two gold wires to the light-emitting die. The first conductive metal plate is arranged to space from the first or second copper foil, whereby an electrical capacitor is formed between the first or second copper foil and the first conductive metal plate. The present invention effectively prevents burnout of gold wires caused by static electricity.

11 Claims, 8 Drawing Sheets

LED LIGHT WITH ELECTROSTATIC PROTECTION AND BACKLIGHT MODULE USING THE LED LIGHT

BACKGROUND OF THE INVENTION

1. Field of the Invention

The present invention relates to an LED (Light-Emitting Diode) light, and in particular to an LED light with electrostatic protection and a backlight module using the LED light.

2. The Related Arts

An LED usually uses a P-N junction of semiconductor to cause injection of minor charge carriers (electrons or holes) and these minor carries are re-combined to give off light. In other words, upon application of a positive bias to specific element of the semiconductor, the electrons and holes are expelled to pass through a recombination zone between the anode and the cathode and recombine with each other. Such a recombined state has an energy level that is lower than the energy level of the separate state of the electrons and holes, so that a difference of energy is generated and light is given off.

An LED light is operated with a low voltage and shows a high efficiency of light emission. Thus, the LED light has been widely used in for example household appliances, remote controlling, electrical displays, indicators, and automatic equipment.

Particularly, with the continuous reduction of the general size of communication devices, the components, such as electrical resistors and electrical capacitors, which are used to constitute components of various equipment are also subjected to size reduction. Thus, the LED light can be direction mounted on a printed circuit board in the form of for example surface-mounted device (SMD).

It is, however, often that the SMD LED light gets burned out due to static electricity or reverse biasing. To overcome such a drawback of the LED light, the conventional LED light is often provided with a voltage stabilizing diode. A Zener diode is one of the voltage stabilizing diodes and is very commonly used in the conventional LED lights. In an LED light, a Zener diode is connected parallel to an LED die in a reverse biasing manner. When an instantaneous voltage (electrostatic potential) is applied through the cathode to the LED light, since the Zener diode has a lower impedance in such a direction, the instantaneous current will flow through the Zener diode thereby preventing the instantaneous voltage from causing any damage to the LED die.

However, the Zener diode itself is black in color and absorbs light in the LED light to thereby cause optic loss and lower luminous intensity of the LED light. In the manufacture process, a Zener diode is of vertical electrode and die bonding must be effected with electrically conductive sliver paste, which is different from the silicone based die bonding substance used for regular horizontal-electrode light-emitting die, so that the two must be separated in the manufacture process and an additional step of die bonding must be included thereby increasing the manufacture cost.

SUMMARY OF THE INVENTION

Thus, an object of the present invention is to provide an LED light with electrostatic protection, which require less manufacturing steps, has a low cost, and improves, to some extents, brightness.

Another object of the present invention is to provide a backlight module that uses an LED light with electrostatic protection to increase the yield rate and reduces the manufacture cost.

To achieve the objects, the present invention provides an LED light with electrostatic protection, which comprises: a carrying frame, a light-emitting die mounted in the carrying frame, and an encapsulation resin encapsulating the light-emitting die in the carrying frame. The carrying frame comprises a frame body, first and second copper foils mounted in the frame body, and a first conductive metal plate mounted in the frame body. The first and second copper foils are respectively and electrically connected by two gold wires to the light-emitting die. The first conductive metal plate is arranged to space from the first or second copper foil, whereby an electrical capacitor is formed between the first or second copper foil and the first conductive metal plate.

The first conductive metal plate has an electrical resistivity of $10^{-6} \Omega \cdot m$. A filling material is arranged between the first conductive metal plate and the first copper foil. The filling material having a resistance greater than $10^{11} \Omega$.

The first and second copper foils respectively serve as anode copper foil and cathode copper foil. The anode and cathode copper foils both extend outside the frame body to respectively form a negative lead and a positive lead.

The first conductive metal plate is located above or below the first or second copper foil.

The frame body comprises a second conductive metal plate. The second conductive metal plate is arranged to space from the first or second copper foil, whereby an additional electrical capacitor is formed between the first or second copper foil and the second conductive metal plate. The second conductive metal plate is located above or below the first or second copper foil.

The present invention also provides a backlight module, which comprises a backplane and a backlight source arranged in the backplane. The backlight source comprises a printed circuit board and a plurality of LED lights mounted to and electrically connected to the circuit board. Each of the LED lights comprises a carrying frame, a light-emitting die mounted in the carrying frame, and an encapsulation resin encapsulating the light-emitting die in the carrying frame. The carrying frame comprises a frame body, first and second copper foils mounted in the frame body, and a first conductive metal plate mounted in the frame body. The first and second copper foils are respectively and electrically connected by two gold wires to the light-emitting die. The first conductive metal plate is arranged to space from the first or second copper foil, whereby an electrical capacitor is formed between the first or second copper foil and the first conductive metal plate.

The first conductive metal plate has an electrical resistivity of $10^{-6} \Omega \cdot m$. A filling material is arranged between the first conductive metal plate and the first copper foil. The filling material has a resistance greater than $10^{11} \Omega$.

The first conductive metal plate is located above or below the first or second copper foil.

The frame body comprises a second conductive metal plate. The second conductive metal plate is arranged to space from the first or second copper foil, whereby an additional electrical capacitor is formed between the first or second copper foil and the second conductive metal plate. The second conductive metal plate is located above or below the first or second copper foil.

The backlight module further comprises a reflector plate arranged inside the backplane, a light guide plate disposed on the reflector plate, an optic film assembly disposed on the light guide plate, and a mold frame mounted to the backplane.

The efficacy of the present invention is that the present invention provides an LED light with electrostatic protection that arranges conductive metal plate(s) adjacent to anode and/or cathode copper foils of the LED light to replace the Zener diode used in the known techniques in order to effectively prevent burnout of gold wires caused by static electricity and also improve luminous intensity of the LED light, reduce manufacture steps, and lower manufacture cost. The present invention also provides a backlight module, which uses an LED light with electrostatic protection so as to increase the yield rate and reduce the manufacture cost.

For better understanding of the features and technical contents of the present invention, reference will be made to the following detailed description of the present invention and the attached drawings. However, the drawings are provided for the purposes of reference and illustration and are not intended to impose undue limitations to the present invention.

BRIEF DESCRIPTION OF THE DRAWINGS

The technical solution, as well as beneficial advantages, will be apparent from the following detailed description of an embodiment of the present invention, with reference to the attached drawings. In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
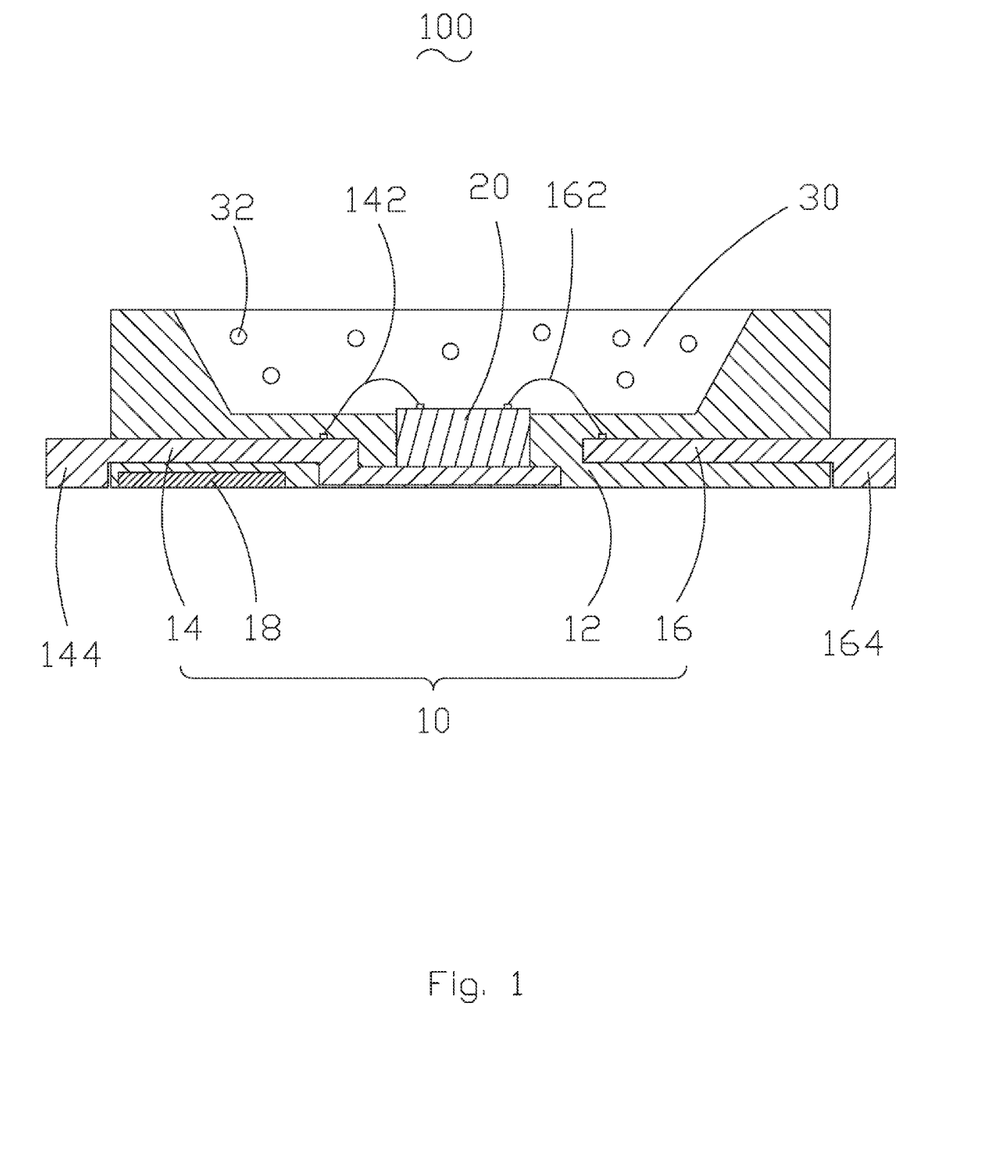
FIG. 1 is a cross-sectional view showing an LED light with electrostatic protection according to a first embodiment of the present invention.

Referring to FIG. 1, the present invention provides an LED (Light-Emitting Diode) light with electrostatic protection, generally designated at 100, comprising: a carrying frame 10, a light-emitting die 20 mounted in the carrying frame 10, and an encapsulation resin 30 encapsulating the light-emitting die 20 in the carrying frame 10. The encapsulation resin 30 is mixed with a fluorescent powder 32 in order to improve the overall luminous intensity of the LED light 100.

The carrying frame 10 comprises a frame body 12, first and second copper foils 14, 16 mounted in the frame body 12, and a first conductive metal plate 18 mounted in the frame body 12. The first and second copper foils 14, 16 are respectively and electrically connected by two gold wires 142, 162 to the light-emitting die 20. The first and second copper foils 14, 16 respectively serve as anode copper foil and cathode copper foil. The anode and cathode copper foils both extend outside the frame body 12 to respectively form a negative lead 144 and a positive lead 164. Since the light-emitting die 20 cannot be directly bonded to the carrying frame 10, a known solution is to bond the light-emitting die 20 to the first or second copper foil 14, 16. In the instant embodiment, the light-emitting die 20 being bonded to the first copper foil 14 is taken as an example for illustration, but the way of bonding the light-emitting die 20 is not limited thereto.

The first conductive metal plate 18 is arranged to space from the first or second copper foil 14, 16 and thus an electrical capacitor is induced between the first or second copper foil 14, 16 and the first conductive metal plate 18.

In the instant embodiment, the first conductive metal plate 18 is arranged under the first copper foil 14 so that an electrical capacitor is formed between the first copper foil 14 and the first conductive metal plate 18.

Figure 2:
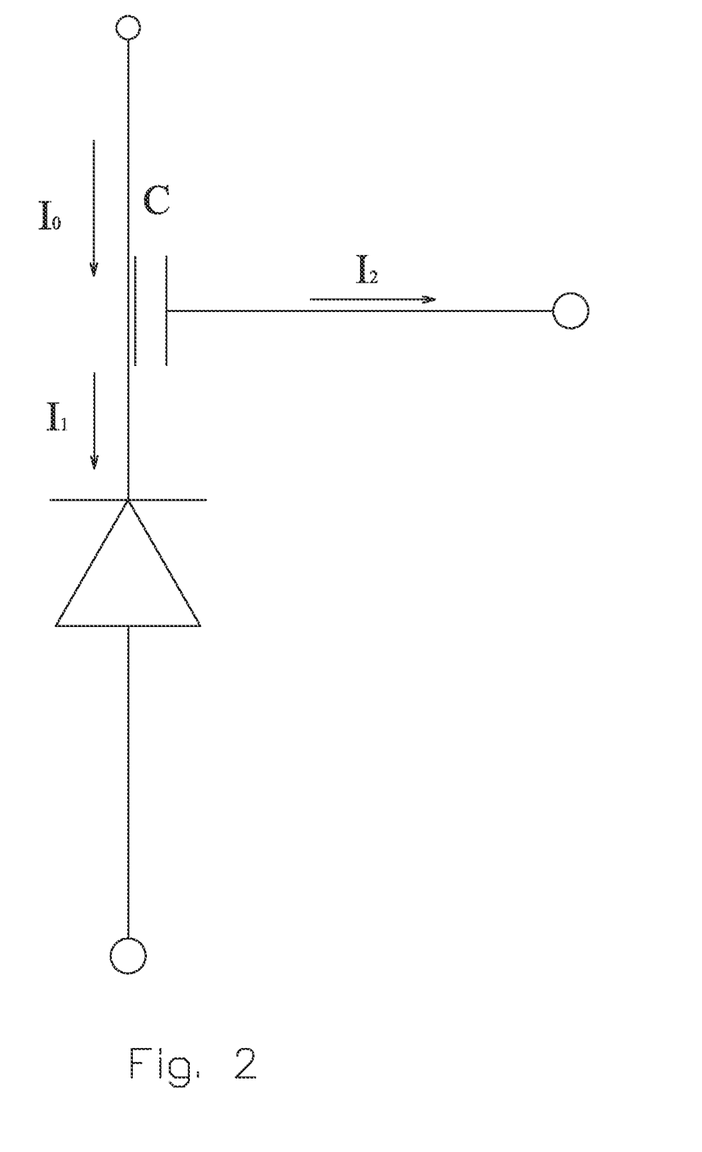
FIG. 2 is a schematic view illustrating circuit principle of electrostatic shock circuit portion of FIG. 1.

Further, as shown in FIG. 2, which is a schematic view illustrating circuit principle of electrostatic shock circuit portion of the LED light with electrostatic protection according to the present invention, when an electrostatic current flows, the relationship among electrical currents is: $I_0^2 = I_1^2 + I_2^2$, and the current $I_2$ shows the following relationship: $I_2 = V/Rc = V/(1/(2\pi fc)) = 2\pi fs \in V/d$, where V is electrostatic potential, Rc is impedance of capacitor C, f is electrostatic frequency, c is capacitance of the capacitor C, s is an area of overlapping between the first conductive metal plate 18 and the first copper foil 14, $\in$ is dielectric constant, d is the distance between the first conductive metal plate 18 and the first copper foil 14.

An example will be given with reference to a set of illustrative parameters. The frame body of the carrying frame 10 is a composite material of phenylpropanolamine, whose dielectric constant is $\in=3.2$; the surface area of the first conductive metal plate 18 is $s=1.5\times1.5$ mm$^2$; the distance between the first conductive metal plate 18 and the first copper foil 14 is d=0.2 mm; and electrostatic response time is t=60 ns and frequency f=1/t. It obtains that $I_2=7539822$ kA. In other words, by placing a first conductive metal plate 18 under the first copper foil 14, when an electrostatic shock is applied to the LED light 100, the capacitor C between the first copper foil 14 and the first conductive metal plate 18 consumes most of the electrical charges and thus protecting the LED light 100 from damage caused by the static electricity.

Preferably, the first conductive metal plate 18 has an electrical resistivity of $10^{-6}$ Ω·m. A filling material is present between the first conductive metal plate 18 and the first copper foil 14 and the filling material has a resistance greater than $10^{11}$ Ω. The filling material can be the frame body 12, or other material. In the instant embodiment, the filling material is the frame body 12 itself.

Figure 3:
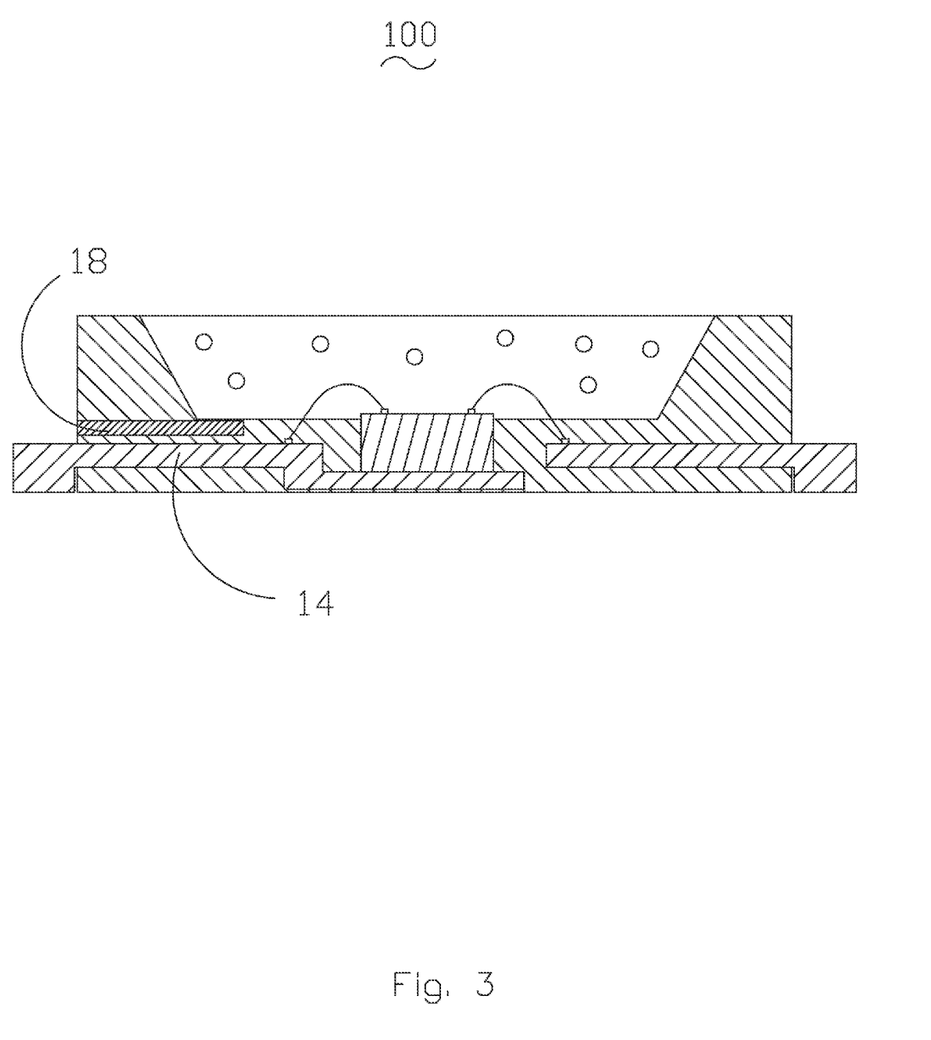
FIG. 3 is a cross-sectional view showing an LED light with electrostatic protection according to a second embodiment of the present invention.

Referring to FIG. 3, which is a cross-sectional view showing an LED light with electrostatic protection according to a second embodiment of the present invention, in the instant embodiment, the first conductive metal plate 18 is located above the first copper foil 14.

Figure 4:
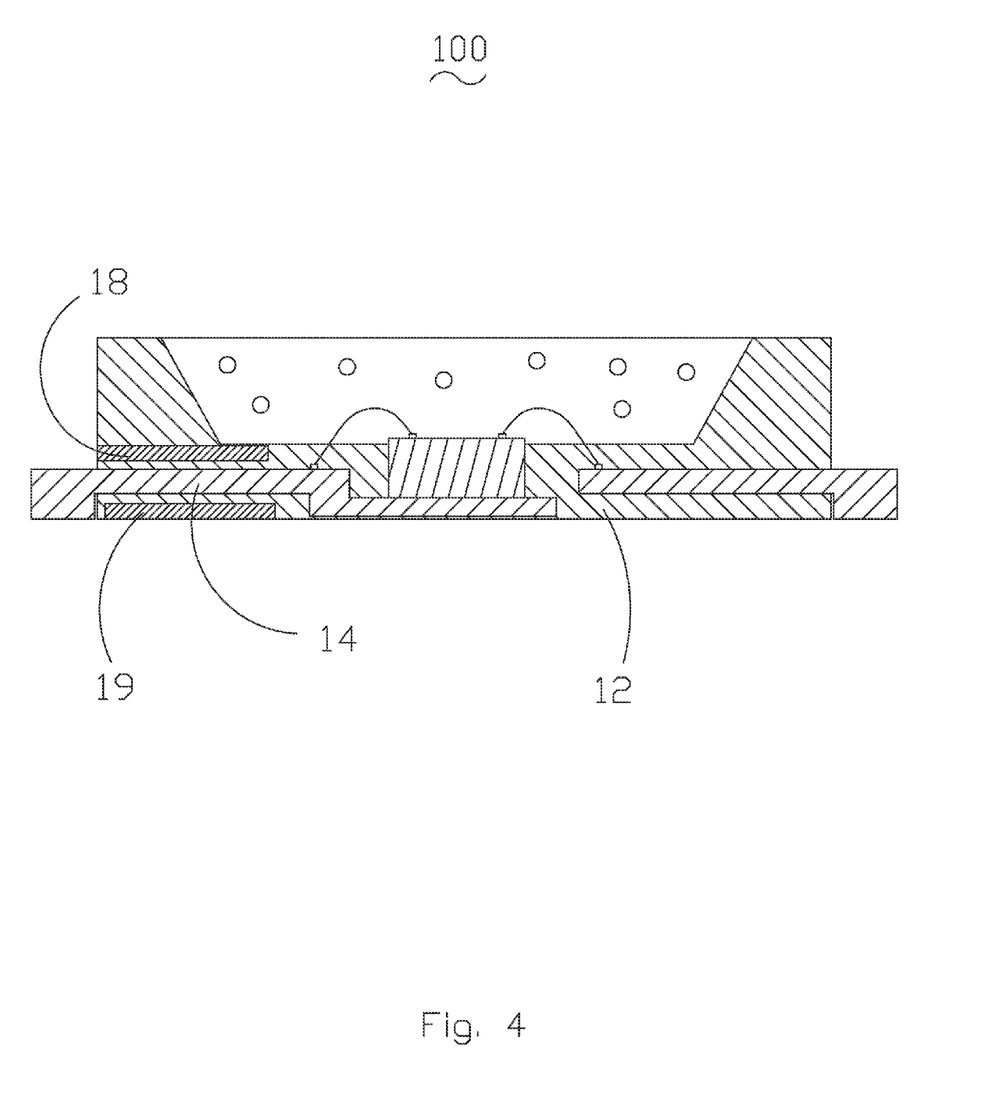
FIG. 4 is a cross-sectional view showing an LED light with electrostatic protection according to a third embodiment of the present invention.

Referring to FIG. 4, which is a cross-sectional view showing an LED light with electrostatic protection according to a third embodiment of the present invention, in the instant embodiment, the frame body 12 further comprises a second conductive metal plate 19. The first conductive metal plate 18 is located above the first copper foil 14. Further, the second conductive metal plate 19 is spaced from the first copper foil 14 and the second conductive metal plate 19 is located below the first copper foil 14. Thus, an additional capacitor is formed between the first copper foil 14 and the second conductive metal plate 19 for further consuming electrical charges generated by static electricity and thus protecting the LED light 100 from damage caused by static electricity.

Figure 5:
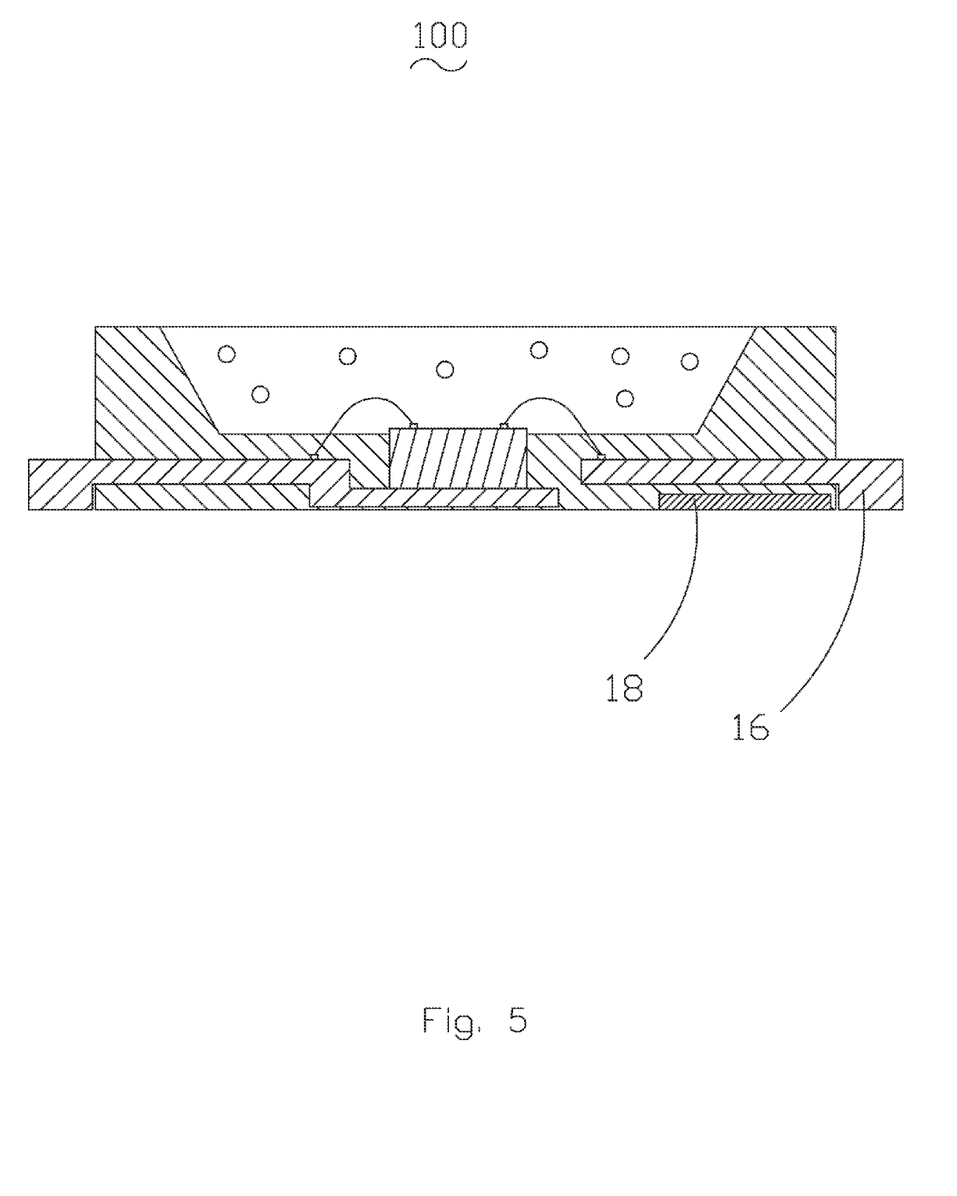
FIG. 5 is a cross-sectional view showing an LED light with electrostatic protection according to a fourth embodiment of the present invention.

Referring to FIG. 5, which is a cross-sectional view showing an LED light with electrostatic protection according to a fourth embodiment of the present invention, in the instant embodiment, the first conductive metal plate 18 is located below the second copper foil 16.

Figure 6:
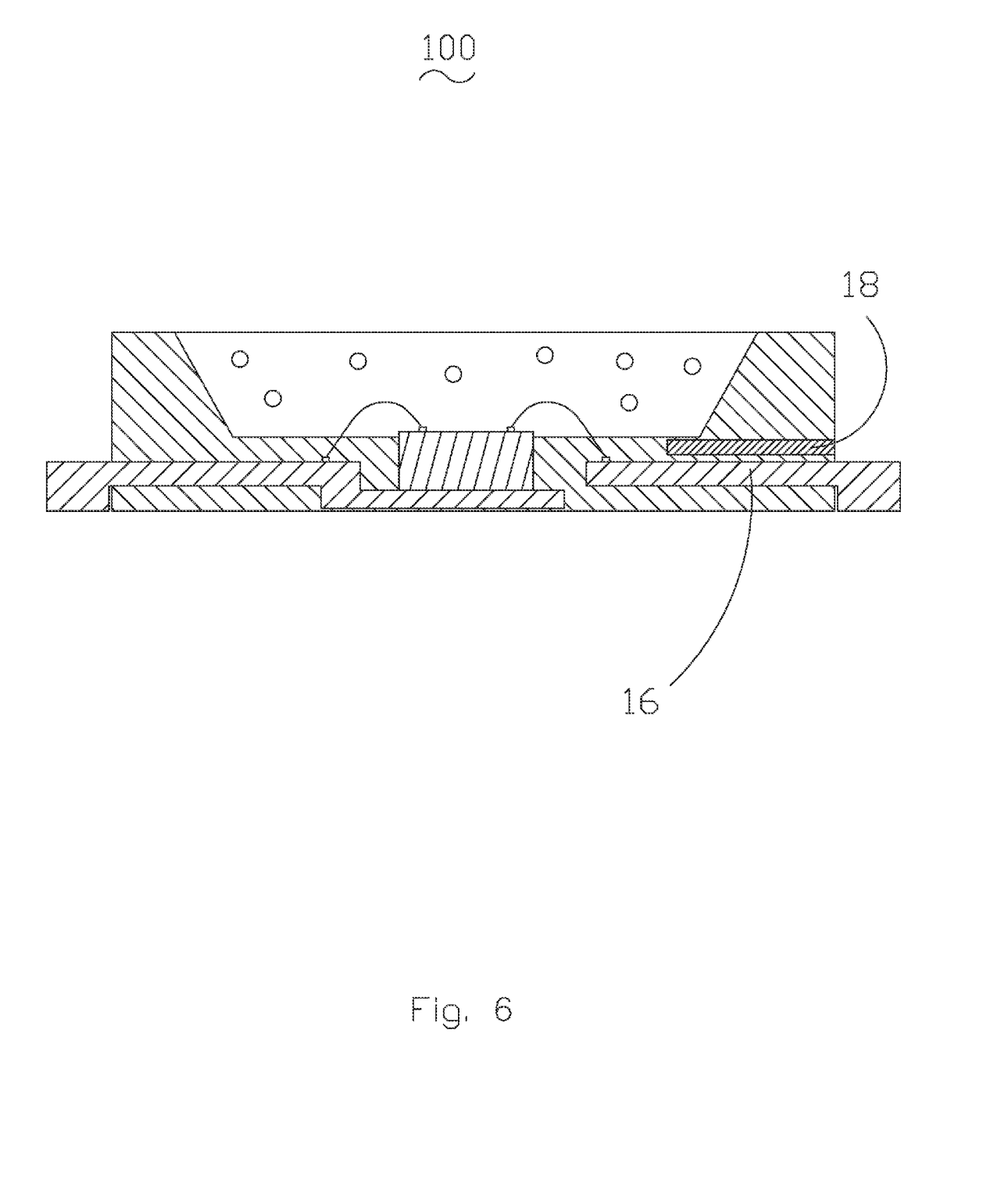
FIG. 6 is a cross-sectional view showing an LED light with electrostatic protection according to a fifth embodiment of the present invention.

Referring to FIG. 6, which is a cross-sectional view showing an LED light with electrostatic protection according to a fifth embodiment of the present invention, in the instant embodiment, the first conductive metal plate 18 is located above the second copper foil 16.

Figure 7:
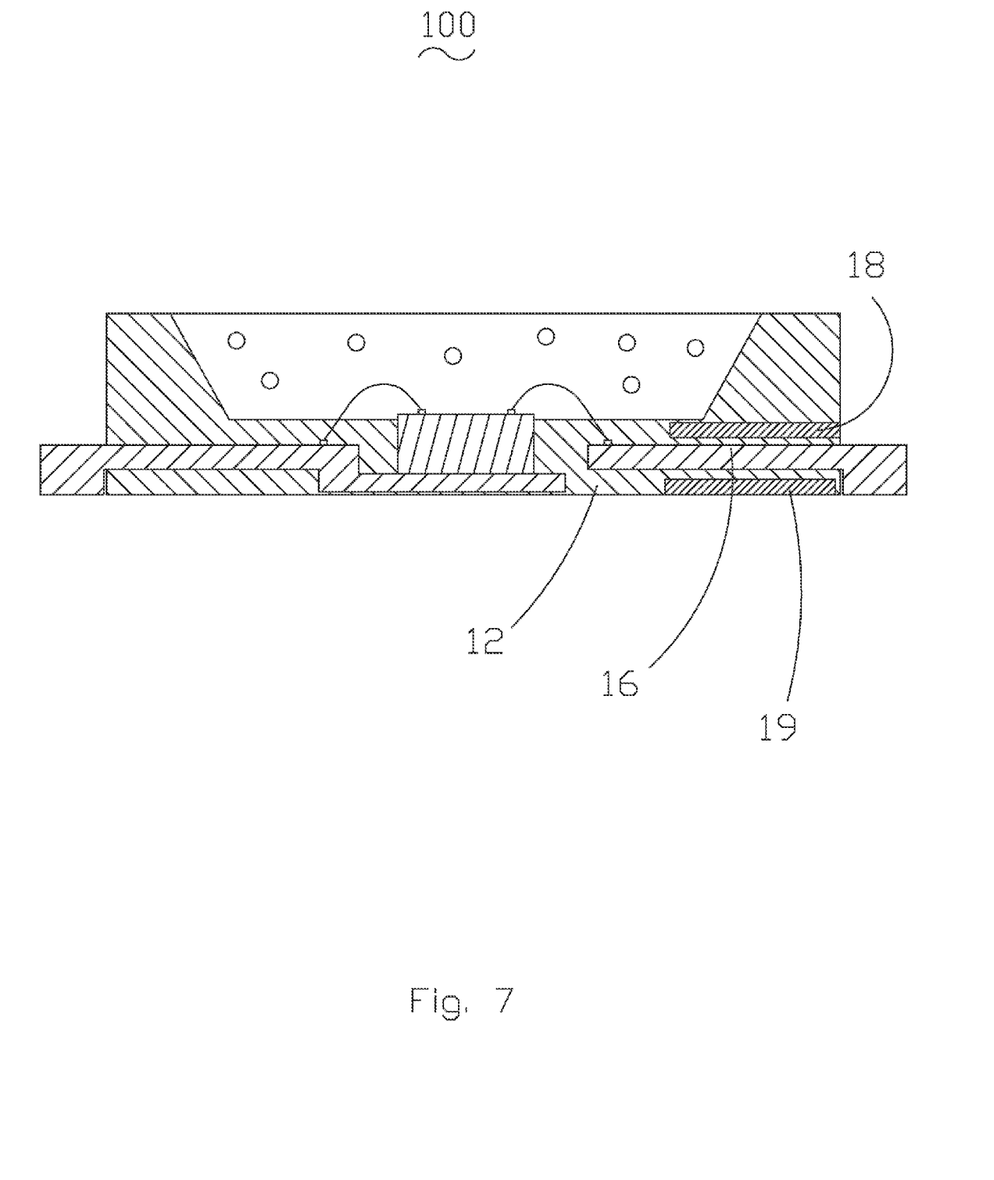
FIG. 7 is a cross-sectional view showing an LED light with electrostatic protection according to a sixth embodiment of the present invention.

Referring to FIG. 7, which is a cross-sectional view showing an LED light with electrostatic protection according to a sixth embodiment of the present invention, in the instant embodiment, the frame body 12 further comprises a second conductive metal plate 19. The first conductive metal plate 18 is located above the second copper foil 16. Further, the second conductive metal plate 19 is spaced from the second copper foil 16 and the second conductive metal plate 19 is located below the second copper foil 16. Thus, an additional capacitor is formed between the second copper foil 16 and the second conductive metal plate 19 for further consuming electrical charges generated by static electricity and thus protecting the LED light 100 from damage caused by static electricity.

As an optional embodiment, the present invention may arrange first and second conducive metal plates respectively above and below each of the first and second copper foils.

The present invention provides an LED light with electrostatic protection that arranges conductive metal plate(s) adjacent to anode and/or cathode copper foils of the LED light to replace the Zener diode used in the known techniques in order to effectively prevent burnout of gold wires caused by static electricity and also improve luminous intensity of the LED light, reduce manufacture steps, and lower manufacture cost.

Figure 8:
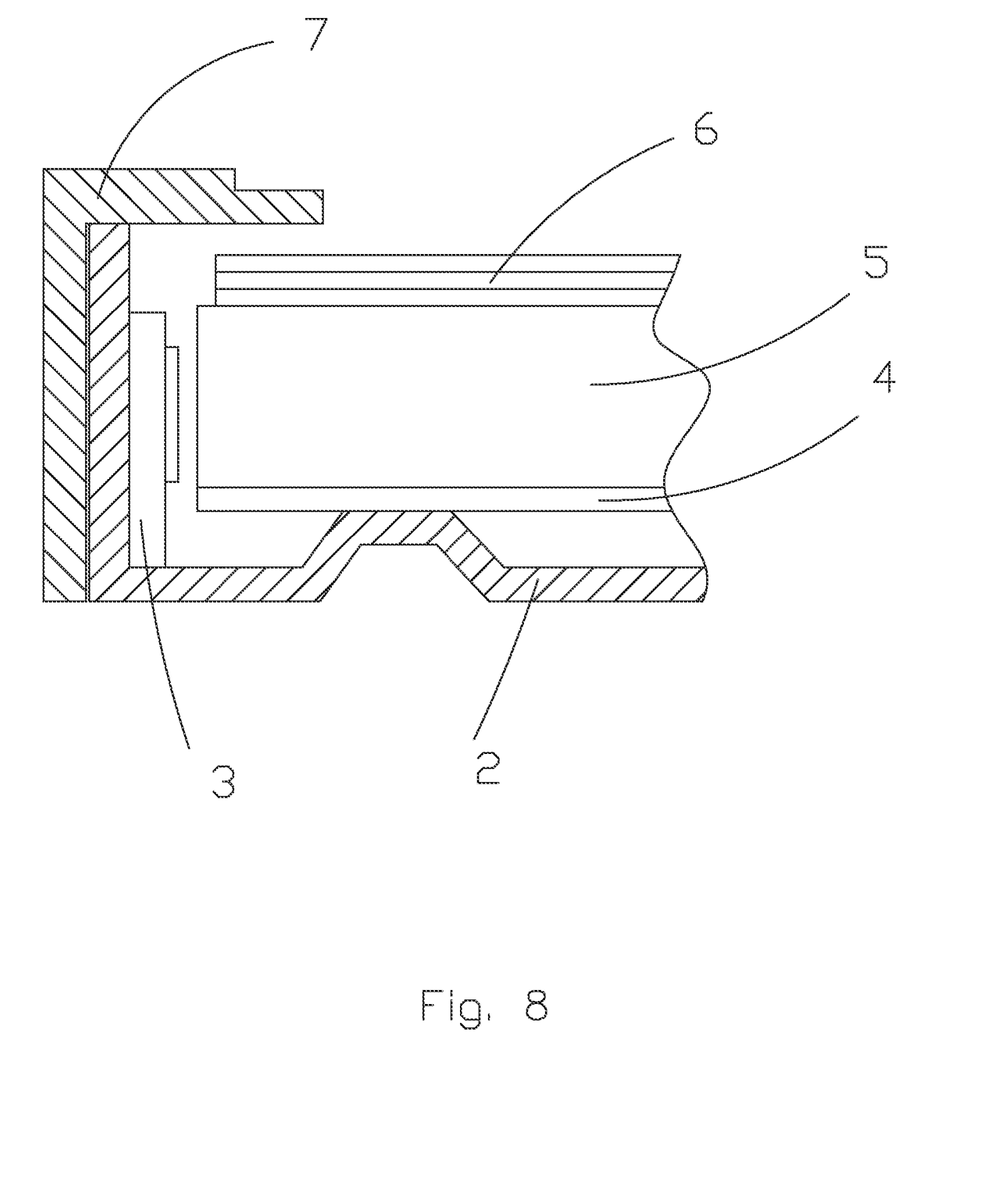
FIG. 8 is schematic view showing the structure of a backlight module according to the present invention.

Referring to FIGS. 1 and 8, the present invention also provides a backlight module, which comprises a backplane 2 and a backlight source 3 arranged in the backplane 2. The backlight source 3 comprises a printed circuit board (PCB) 32 and a plurality of LED lights 100 mounted to and electrically connected to the circuit board 32. Each of the LED lights 100 comprises a carrying frame 10, a light-emitting die 20 mounted in the carrying frame 10, and an encapsulation resin 30 encapsulating the light-emitting die 20 in the carrying frame 10. The encapsulation resin 30 is mixed with a fluorescent powder 32 in order to improve the overall luminous intensity of the LED light 100.

The carrying frame 10 comprises a frame body 12, first and second copper foils 14, 16 mounted in the frame body 12, and a first conductive metal plate 18 mounted in the frame body 12. The first and second copper foils 14, 16 are respectively and electrically connected by two gold wires 142, 162 to the light-emitting die 20. The first and second copper foils 14, 16 respectively serve as anode copper foil and cathode copper foil. The anode and cathode copper foils both extend outside the frame body 12 to respectively form a negative lead 144 and a positive lead 164. Since the light-emitting die 20 cannot be directly bonded to the carrying frame 10, a known solution is to bond the light-emitting die 20 to the first or second copper foil 14, 16. In the instant embodiment, the light-emitting die 20 being bonded to the first copper foil 14 is taken as an example for illustration, but the way of bonding the light-emitting die 20 is not limited thereto.

The first conductive metal plate 18 is arranged to space from the first or second copper foil 14, 16 and thus an electrical capacitor is formed between the first or second copper foil 14, 16 and the first conductive metal plate 18.

In the instant embodiment, the first conductive metal plate 18 is arranged under the first copper foil 14 so that an electrical capacitor is formed between the first copper foil 14 and the first conductive metal plate 18. When an electrostatic shock is applied to the LED light 100, the capacitor between the first copper foil 14 and the first conductive metal plate 18 consumes most of the electrical charges and thus protecting the LED light 100 from damage caused by the static electricity and increasing the yield rate of the backlight module.

Preferably, the first conductive metal plate 18 has an electrical resistivity of $10^{-6}\Omega \cdot m$. A filling material is present between the first conductive metal plate 18 and the first copper foil 14 and the filling material has a resistance greater than $10^{11}\Omega$. The filling material can be the frame body 12, or other material. In the instant embodiment, the filling material is the frame body 12 itself.

The backlight module may further comprises a reflector plate 4 arranged inside the backplane 2, a light guide plate 5 disposed on the reflector plate 4, an optic film assembly 6 disposed on the light guide plate 5, and a mold frame 7 mounted to the backplane 2.

The LED lights 100 used in the backlight module can be embodied in a different way from those described above. Repeated description will be omitted.

The present invention provides a backlight module, which uses an LED light with electrostatic protection so as to increase the yield rate and reduce the manufacture cost.

Based on the description given above, those having ordinary skills of the art may easily contemplate various changes and modifications of the technical solution and technical ideas of the present invention and all these changes and modifications are considered within the protection scope of right for the present invention.

What is claimed is:

1. An LED (Light-Emitting Diode) light with electrostatic protection, comprising: a carrying frame, a light-emitting die mounted in the carrying frame, and an encapsulation resin encapsulating the light-emitting die in the carrying frame, the carrying frame comprising a frame body formed of a material having a resistance greater than $10^{11}\Omega$, first and second copper foils mounted in the frame body, and a first conductive metal plate mounted in the frame body so that the first conductive metal plate is spaced from one of the first and second copper foils by an integral portion of the material of the frame body, the first and second copper foils being respectively and electrically connected by two gold wires to the light-emitting die, the first conductive metal plate being arranged to space from the first or second copper foil, whereby an electrical capacitor is formed between the first or second copper foil and the first conductive metal plate.

2. The LED light with electrostatic protection as claimed in claim 1, wherein the first conductive metal plate has an electrical resistivity of $10^{-6}\Omega \cdot m$.

3. The LED light with electrostatic protection as claimed in claim 1, wherein the first and second copper foils respectively serve as anode copper foil and cathode copper foil, the anode and cathode copper foils both extending outside the frame body to respectively form a negative lead and a positive lead.

4. The LED light with electrostatic protection as claimed in claim 1, wherein the first conductive metal plate is located above or below the first or second copper foil.

5. The LED light with electrostatic protection as claimed in claim 1, wherein the frame body comprises a second conductive metal plate, the second conductive metal plate being arranged to space from the first or second copper foil with an integral portion of the material of the frame body interposed therebetween, whereby an additional electrical capacitor is formed between the first or second copper foil and the second conductive metal plate, the second conductive metal plate being located above or below the first or second copper foil.

6. A backlight module, comprising a backplane and a backlight source arranged in the backplane, the backlight source comprising a printed circuit board and a plurality of LED (Light-Emitting Diode) lights mounted to and electrically connected to the circuit board, each of the LED lights comprising a carrying frame, a light-emitting die mounted in the carrying frame, and an encapsulation resin encapsulating the light-emitting die in the carrying frame, the carrying frame comprising a frame body formed of a material having a resistance greater than $10^{11}\Omega$, first and second copper foils mounted in the frame body, and a first conductive metal plate mounted in the frame body so that the first conductive metal plate is spaced from one of the first and second copper foils by an integral portion of the material of the frame body, the first and second copper foils being respectively and electrically connected by two gold wires to the light-emitting die, the first conductive metal plate being arranged to space from the first or second copper foil, whereby an electrical capacitor is formed between the first or second copper foil and the first conductive metal plate.

7. The backlight module as claimed in claim 6, wherein the first conductive metal plate has an electrical resistivity of $10^{-6}\Omega\cdot m$.

8. The backlight module as claimed in claim 6, wherein the first conductive metal plate is located above or below the first or second copper foil.

9. The backlight module as claimed in claim 6, wherein the frame body comprises a second conductive metal plate, the second conductive metal plate being arranged to space from the first or second copper foil with an integral portion of the material of the frame body interposed therebetween, whereby an additional electrical capacitor is formed between the first or second copper foil and the second conductive metal plate, the second conductive metal plate being located above or below the first or second copper foil.

10. The backlight module as claimed in claim 6 further comprising a reflector plate arranged inside the backplane, a light guide plate disposed on the reflector plate, an optic film assembly disposed on the light guide plate, and a mold frame mounted to the backplane.

11. A backlight module, comprising a backplane and a backlight source arranged in the backplane, the backlight source comprising a printed circuit board and a plurality of LED (Light-Emitting Diode) lights mounted to and electrically connected to the circuit board, each of the LED lights comprising a carrying frame, a light-emitting die mounted in the carrying frame, and an encapsulation resin encapsulating the light-emitting die in the carrying frame, the carrying frame comprising a frame body formed of a material having a resistance greater than $10^{11}\Omega$, first and second copper foils mounted in the frame body, and a first conductive metal plate mounted in the frame body so that the first conductive metal plate is spaced from one of the first and second copper foils by an integral portion of the material of the frame body, the first and second copper foils being respectively and electrically connected by two gold wires to the light-emitting die, the first conductive metal plate being arranged to space from the first or second copper foil, whereby an electrical capacitor is formed between the first or second copper foil and the first conductive metal plate;
    wherein the first conductive metal plate has an electrical resistivity of $10^{-6}\Omega\cdot m$;
    wherein the first conductive metal plate is located above or below the first or second copper foil; and
    a reflector plate being arranged inside the backplane, a light guide plate being disposed on the reflector plate, an optic film assembly being disposed on the light guide plate, and a mold frame being mounted to the backplane.

\* \* \* \* \*